United States Patent [19]
Zommer

[11] Patent Number: 5,381,025
[45] Date of Patent: Jan. 10, 1995

[54] INSULATED GATE THYRISTOR WITH GATE TURN ON AND TURN OFF

[75] Inventor: Nathan Zommer, Los Altos, Calif.

[73] Assignee: Ixys Corporation, San Jose, Calif.

[21] Appl. No.: 961,041

[22] Filed: Oct. 14, 1992

Related U.S. Application Data

[63] Continuation of Ser. No. 679,415, Apr. 2, 1991, abandoned, which is a continuation-in-part of Ser. No. 542,273, Jun. 22, 1990, abandoned, which is a continuation-in-part of Ser. No. 395,398, Aug. 17, 1989, abandoned.

[51] Int. Cl.6 ............... H01L 29/74; H01L 29/72; H01L 29/00
[52] U.S. Cl. .................... 257/138; 257/147; 257/152
[58] Field of Search ............ 357/38, 35, 36, 37, 357/16; 257/139, 144, 152, 138, 147

[56] References Cited

U.S. PATENT DOCUMENTS

| | | | |
|---|---|---|---|
| 4,199,774 | 4/1980 | Plummer | 357/41 |
| 4,495,513 | 1/1985 | Descamps | 357/43 |
| 4,532,534 | 7/1985 | Ford et al. | 357/23.4 |
| 4,593,302 | 6/1986 | Lidow et al. | 357/23.4 |
| 4,620,211 | 10/1986 | Baliga et al. | 357/38 |
| 4,630,084 | 12/1986 | Tihanyi | 357/23.4 |
| 4,682,195 | 7/1987 | Yilmaz | 357/23.4 |
| 4,881,119 | 11/1989 | Paxman et al. | 357/23.4 |
| 4,881,120 | 11/1989 | Nakagawa et al. | 357/23.4 |
| 4,884,114 | 11/1989 | Spenke et al. | 357/38 |
| 4,901,127 | 2/1990 | Chow et al. | 357/23.4 |
| 4,998,156 | 3/1991 | Goodman et al. | 357/42 |
| 5,034,785 | 7/1991 | Blanchard | 357/23.4 |

FOREIGN PATENT DOCUMENTS 61-222260 10/1986 Japan ............... 357/23.4

OTHER PUBLICATIONS

M. Stoisiek et al., "Power Devices With MOS-Controlled...", Siemens Forsch-U. Entwickl. -Ber. BD 14 (1985), pp. 45–49.

V. A. K. Temple, "Power Device Evolution and the MOS-Controlled Thyristor", PCIM, Nov. 1987, pp. 23, 25–29.

Primary Examiner—Jerome Jackson
Assistant Examiner—D. Monin
Attorney, Agent, or Firm—Townsend and Townsend Khourie and Crew

[57] ABSTRACT

An insulated gate thyristor (IGTH) (40,80) that is built on IGBT technology rather than SCR or thyristor technology. The device provides the low on-resistance of a thyristor with the gate turn-on and turn-off capability of an IGBT. The device may be fabricated in a somewhat modified IGBT process, in a cellular (40) or stripe (80) configuration. First the process is modified (by reduced doping) in order to promote (rather than inhibit) latch-up. Second, certain regions (52) are formed without source diffusions to create a lateral MOSFET ($T_5$) that can turn off the latched IGBT.

18 Claims, 4 Drawing Sheets

INSULATED GATE THYRISTOR WITH GATE TURN ON AND TURN OFF

CROSS REFERENCE TO RELATED APPLICATIONS

This is a continuation of application Ser. No. 07/679,415, filed Apr. 2, 1991, now abandoned which is a continuation-in-part of Ser. No. 07/542,273, filed Jun. 22, 1990, now abandoned which is a continuation-in-part of application Ser. No. 07/395,398 filed Aug. 17, 1989, now abandoned.

BACKGROUND OF THE INVENTION

The present invention relates generally to semiconductor switching devices and more particularly to such a devices based on insulated gate bipolar transistor (IGBT) technology.

The ideal power switching device would be characterized by fast switching speed, low on-resistance, and ease of control. Known power devices include thyristors, which provide very low on-resistance, but require special techniques for control; insulated gate bipolar transistors (IGBTs), which are designed to avoid latch latch-up and are thus easier to turn on and turn off, but have a higher on-resistance than thyristors; and insulated gate field effect transistors (IGFETs), which are faster than IGBTs but have a higher on-resistance. IGFETs are usually referred to as MOSFETs (metal-oxide-semiconductor field effect transistors), even though most modern IGFETs have polysilicon rather than metal gates.

Thyristors are regenerative devices, which means that they latch on as long as there is a current flowing that is above a certain holding current. A regular thyristor (or SCR) cannot be turned off unless the current that passes is less than the holding current. There have been efforts to create a MOS-controlled thyristor, but most reported devices are actually thyristors to which MOSFETs have been added. Such devices typically utilize a MOSFET that is turned on in order to provide an "emitter" short that turns off the thyristor.

The idea of using a MOSFET to turn off a thyristor (or SCR) was introduced by V. A. K. Temple of General Electric. The concept required two gates for the device, one for turn-on (the usual SCR gate) and one for turn-off (the MOSFET gate). However, manufacturing the device required the complex task of merging crude thyristor-like semiconductor processing with the high purity, fine geometry requirements of MOSFET processing. Merging these two processes resulted in a MOS-controlled thyristor process that was complex, low yielding, and with more masking and diffusion steps than are required for a thyristor or MOSFET separately.

SUMMARY OF THE INVENTION

The present invention provides a superior insulated gate thyristor (IGTH) that is built on IGBT technology rather than SCR or thyristor technology. The device provides the low on-resistance of a thyristor with the gate turn-on and turn-off capability of an IGBT.

In brief, the device may be fabricated in a cellular or stripe configuration, using a somewhat modified IGBT process. First, the process is modified (by reduced doping) in order to promote (rather than inhibit) latch-up. Second, certain regions are formed without source diffusions to create a lateral MOSFET that can turn off the latched IGBT.

In the context of an n-channel process and a cellular configuration, certain of the p/p+ diffusion areas are masked during the n+ source diffusion to create special cells. The gate overlying the region between the special cells and the normal cells provides a lateral p-channel device that provides the turn-off mechanism. The special cells provide an extra vertical PNP bipolar transistor that provides a parallel conduction path when the thyristor is latched, and aids in the turn-off by diverting current from the thyristor.

The benefits of the present invention are achieved in the context of a known technology, with modifications as outlined above. No extra masking steps are required.

A further understanding of the nature and advantages of the present invention may be realized by reference to the remaining portions of the specification and the attached drawings.

DESCRIPTION OF SPECIFIC EMBODIMENTS

Prior Art IGBTs

Figure 1A:
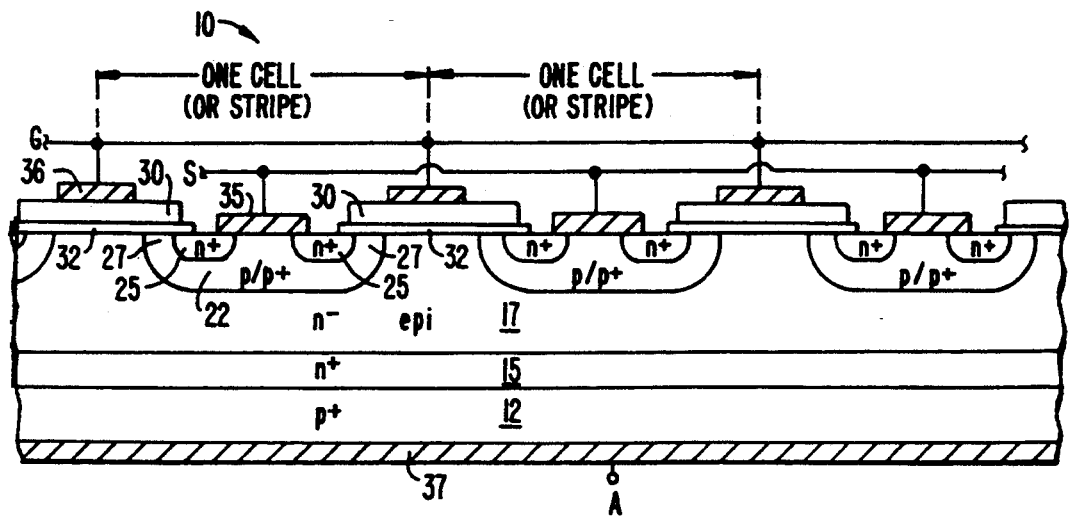
FIG. 1A is a schematic cross-section of a prior art IGBT structure.

FIG. 1A is a simplified sectional view of a prior art insulated gate bipolar transistor (IGBT) chip 10. As will be discussed below, the active area of a typical chip may consist of hundreds or thousands of microscopically small regions, each defining an active device. For the IGBT shown in FIG. 1B, the regions are cells 11. All the cells in the active area are the same and are connected in parallel. For the IGBT shown in FIG. 1C, the regions are stripes 11' rather than cells.

IGBT 10 is typically fabricated by a double-diffused MOS (DMOS) process, as is well known in the art. (As alluded to above, the use of the term "MOS" or "MOSFET" is not intended to imply a metal gate). A p+ substrate 12 has its upper surface region doped to define an n+ layer 15. An n− epitaxial (epi) layer 17 is formed on the surface of the substrate and the active regions are formed therein. A typical cell 11 of the IGBT comprises a p/p+ body 22 (sometimes called the p-well) formed in epi layer 17 and an n+ region 25 formed within the perimeter of body 22. Body 22 is p-type over most of its lateral extent with one or more central regions doped p+. The portion of body 22 adjacent the surface and between the source region and the n− epi layer defines a channel region 27.

A polysilicon layer 30 overlies the channel region and the regions between cells, and is separated from the epi surface by a thin layer 32 of gate oxide. The polysilicon extends over the surface of the device with an opening at each cell (for source and body metallization) so as to form a common gate electrode for all the cells in the device. Portions 35 of a top metal layer connect n+ region 25 to a common source node S. Other portions 36 of the top metal layer connect the polysilicon layer to a common gate node $G_1$. A metal layer 37 is formed on the bottom surface of the substrate to form a bottom electrode A common to all cells of the device.

As is well known, certain areas of the chip are referred to as non-active areas. These includes the peripheral areas occupied by the guard rings, the area under the gate pad, the area under and alongside the gate spine(s), and possibly the area under the source pad. The non-active areas of the chip do not contain active cells and are only mentioned in passing by way of background.

Figure 1B:
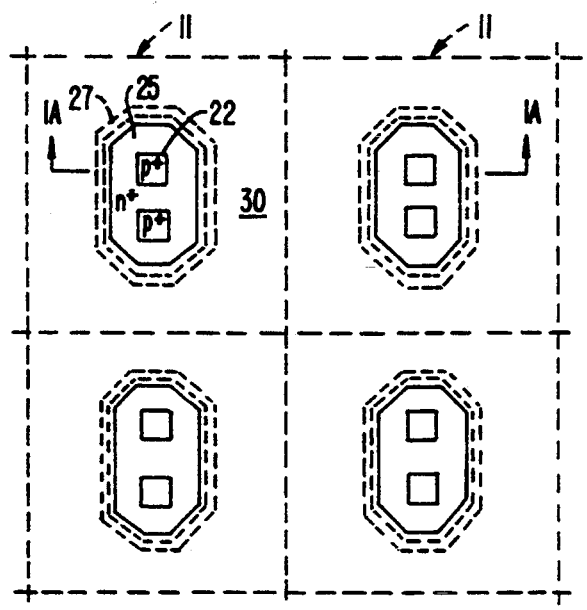
FIG. 1B is a top view showing a possible cell layout of the IGBT of FIG. 1A.

FIG. 1B shows a simplified top view of a typical layout of an embodiment laid out in cells 11. The solid octagon denotes the opening in the gate polysilicon layer while the dashed lines show the channel region under the gate (bounded by the p-well boundary and the source region boundary). This particular type of cell has the n+ source region formed so that the body portion contacts the epi surface in two regions (denoted by solid rectangles). The contact opening for the source/body contact extends over both these regions and the intermediate n+ region. This type of cell is described in U.S. Pat. No. 4,860,072, issued Aug. 22, 1989.

Figure 1C:
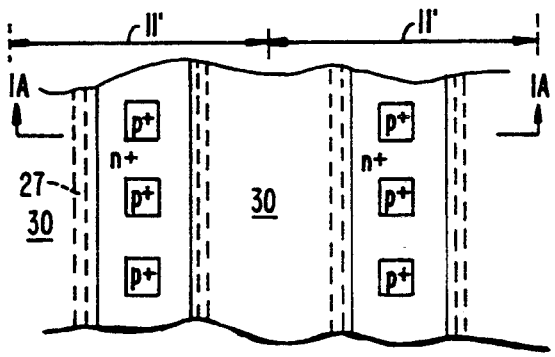
FIG. 1C is a top view showing a possible stripe layout of the IGBT of FIG. 1A.

FIG. 1C shows a simplified top view of an embodiment laid out in stripes 11'. In this embodiment, the p-well, channel, and source region extend longitudinally.

Figure 2:
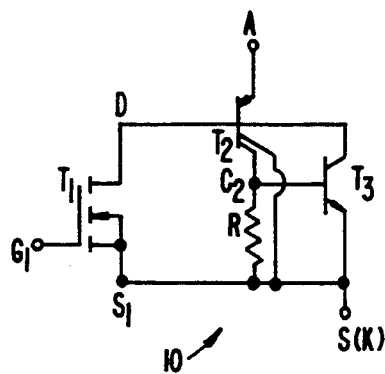
FIG. 2 is a schematic of the equivalent circuit of the IGBT of FIG. 1A.

FIG. 2 shows the equivalent circuit of IGBT 10, which consists of an n-channel MOSFET $T_1$, a PNP bipolar transistor $T_2$, an NPN bipolar transistor $T_3$, and a resistor R. MOSFET $T_1$ has its drain defined by epi layer 17, its gate by the portions of polysilicon layer 30 that overlie channel region 27, and its source by n+ region 25. PNP transistor $T_2$ has its emitter defined by p+ substrate 12, its base by n+ layer 15 and n− epi layer 17, and a pair of collectors defined by the p+ diffusion in p/p+ body 22 and by the p-portion of the body. NPN transistor $T_3$ has its emitter defined by n+ region 25, its base by p/p+ body 22, and its collector by n+ layer 15 and n− epi layer 17. Resistor R is defined by p/p+ body 22.

Transistors $T_2$ and $T_3$ are in a four-layer configuration characteristic of an SCR. In an SCR, resistor R is purposely made high so that current flow through $T_2$ causes $T_3$ to turn on and create a latched condition, characteristic of SCR operation. In an IGBT, however, the latched condition is avoided by making R sufficiently small that the voltage drop across the resistor is never enough to turn transistor $T_3$ on. Thus transistors $T_1$ and $T_2$ are turned on without turning transistor $T_3$ on, and transistors $T_2$ and $T_3$ do not latch up. This allows MOSFET $T_1$ to control the current flow between bottom electrode 37 and source electrode 35. The effect of PNP transistor $T_2$ is to reduce the resistivity of the n− epi of MOSFET $T_1$ when it is on. This phenomenon is referred to as conductivity modulation, and allows single gate turn-on and turn-off with a lower forward voltage drop than is possible with a comparably rated MOSFET.

Fabrication Methods

A typical prior art DMOS fabrication process for vertical n-channel devices may be briefly outlined as follows:

(1) Dope upper portion of p+ substrate n+.
(2) Grow n− epitaxial layer.
(3) Grow localized field oxide to define peripheral non-active areas of the chip.
(4) Deposit gate oxide.
(5) Deposit polysilicon over gate oxide.
(6) Create openings in the polysilicon and gate oxide to define the cells.
(7) Implant p-type dopants aligned to polysilicon openings.
(8) Implant p+ regions within the openings (non-critical alignment).
(9) Diffuse to form p-wells (body).
(10) Mask at least portions of p+ diffusion and implant n+.
(11) Diffuse to form source regions and channel regions.
(12) Deposit CVD oxide over wafer.
(13) Etch poly contacts and source/body contacts.
(14) Deposit metal layer.
(15) Etch metal layer to define gate electrode and source/body electrode.
(16) Passivate.

Based on current understanding, a single diffusion process appears to be preferred, at least for n-channel devices. In this process, the p implant, the p+ implant, and the n+ implant are performed without intervening diffusion steps, and a single diffusion step is used to form the p-wells, the source regions, and the channel regions. Such a process is described in detail in copending application Ser. No. 664,580, filed Mar. 4, 1991, abandoned in favor of application Ser. No. 833,603, filed Feb. 11, 1992, now U.S. Pat. No. 5,187,117, issued Feb. 16, 1993, which is incorporated by reference.

IGTH Embodiments

Figure 3A:
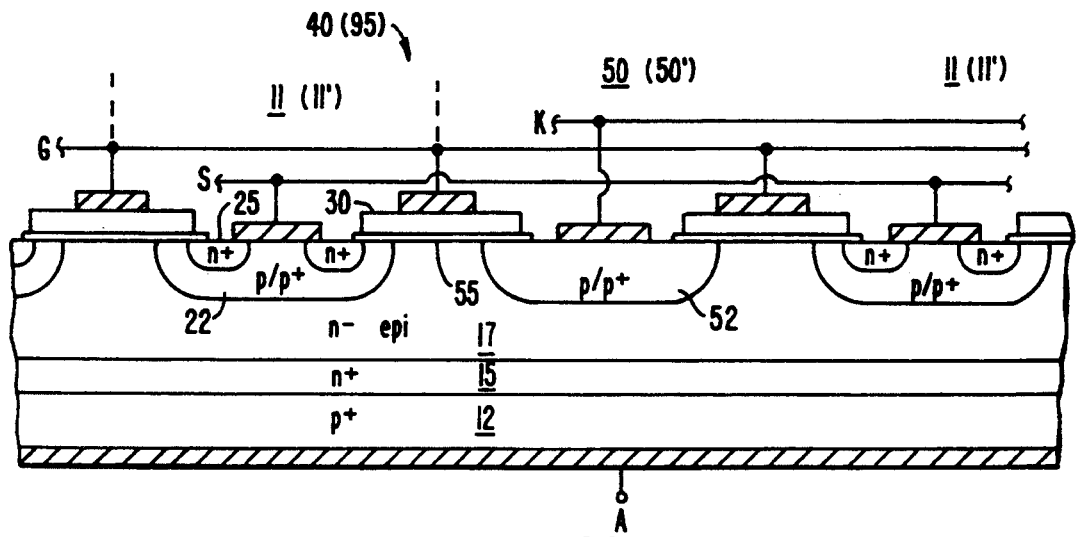
FIG. 3A is a schematic cross-section of an insulated gate thyristor (IGTH) according to the present invention.

FIG. 3A is a simplified sectional view of an insulated gate thyristor (IGTH) 40, implemented in a cellular configuration, according to the present invention. It also provides a sectional view of a stripe configuration 95 to be described below. IGTH 40 is of similar construction to the cellular version of IGBT 10 except that a number of the cells in the active area are altered to define special cells 50. A special cell 50 differs from a normal IGBT cell 11 in it does not have an n+ region corresponding to n+ region 25. The body of a special cell 50 is denoted as 52. This cell differentiation is readily achieved by masking those cells that are to be special cells during the n+ implant step to prevent the introduction of n-type impurities into the special cell bodies. IGTH 40 also differs from IGBT 10 in that body 22 for the normal cells is less heavily doped so that equivalent resistor R is higher (say by an order of magnitude). The higher resistance may be achieved by reducing the p+ implant in the body, or by eliminating the p+ implant entirely while increasing the dose for the p implant. The body portions of the special cells may benefit from increased p+ doping.

Figure 3B:
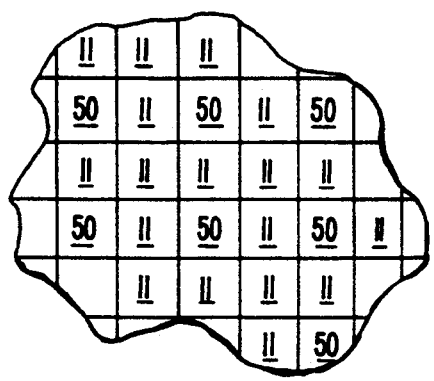
FIG. 3B–C are top views showing possible cell layouts for the IGTH of FIG. 3A.
Figure 3C:
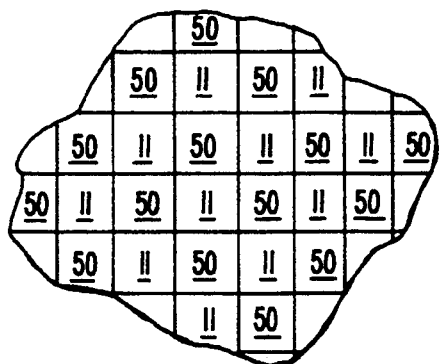

FIGS. 3B and 3C show the cell grid with different possible arrangements for the formation of special cells 50. FIG. 3B shows a configuration where 25% of the cells are special cells. FIG. 3C shows a configuration where 50% of the cells are special cells. The significance of this will be described below.

Figure 4:
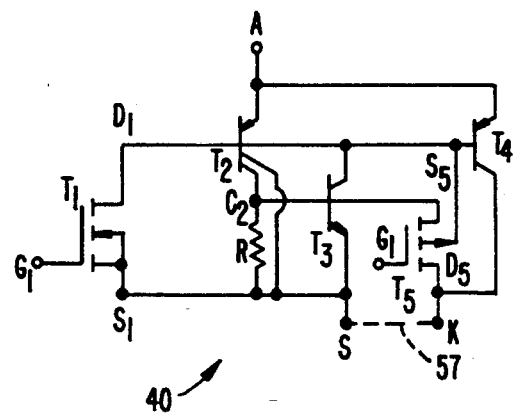
FIG. 4 is a schematic of the equivalent circuit of the IGTH of FIG. 3A.

FIG. 4 is a schematic of the equivalent circuit of IGTH 40. Cells 11, connected in parallel, provide the portions of the structure common with FIG. 2, namely, n-channel MOSFET T1, PNP and NPN transistors $T_2$ and $T_3$, and resistor R. Cells 50, connected in parallel define a vertical PNP transistor $T_4$ and a p-channel MOSFET $T_5$. PNP transistor $T_4$ has its emitter defined by p+ substrate 12, its base by n+ layer 15 and n− epi layer 17, and its collector by p/p+ body 52. MOSFET $T_5$ has its source defined by p/p+ body 52, its drain defined by p/p+ body 22, and its channel region defined by those regions 55 of n− epi layer 17 underlying the intercell portions of polysilicon layer 30. Connections are made to bodies 52 of special cells 50, and these are commonly connected to a node designated K, which may or may not be connected to the common source connection S. FIG. 4 shows S and K as separate nodes with an optional connection 57 shown in phantom.

Consider first the operation of IGTH 40 when a positive voltage (say +15 volts) is applied to gate node $G_1$. This causes MOSFET $T_1$ to turn on, and due to the modified IGBT cell doping, causes bipolar transistors $T_2$ and $T_3$ (the inherent SCR) to latch. (As noted above, the emphasis in normal IGBT design is to avoid a latched condition).

Consider next the operation of IGTH 40 when a negative voltage relative to $S_1$ (say −15 volts) is applied to the gate electrode. This causes the surface of the n− epi layer under the polysilicon (region 55) to invert and thereby define a p-channel, which turns MOSFET $T_5$ on. Turning MOSFET $T_5$ on acts to divert base current from the base of transistor $T_3$ by shorting the resistor, which tends to turn transistor $T_3$ off, thus reversing the latched condition.

If nodes K and S are connected, the result is a 3-pin device. On the other hand, if node K is brought out as a separate pin, the turn-off operation can be enhanced since node K can be biased more negatively than node S during turn-off.

The primary design considerations for IGTH relative to standard IGBT processing are as follows. Latch-up (normally avoided in IGBTs) is promoted by decreasing the doping of the IGBT cells' bodies. To the extent that departures from the standard IGBT wafer (p+/n+/n− epi) are acceptable, the n+ layer can be less heavily doped or eliminated and the p+ layer can be more heavily doped, so as to increase the gain of the PNP transistor. The doping in the p/p+ body controls the resistance R and gain of the NPN transistors. Reducing this doping increases R (promoting latch-up) and increases the gain of the NPN transistor.

To effect turn-off, p-channel MOSFET $T_5$ must compete with NPN transistor $T_3$. Since the on-resistance of one cell of p-channel MOSFET $T_5$ is greater than that of one cell of n-channel MOSFET $T_1$ and much greater than that of one cell of the bipolar devices, a significant number of the special cells may be needed. The relative occurrence of special cells determines forward voltage drop, switching time, and maximum latched current that can be switched off by the gate. While FIGS. 3B–C show arrangements with at most 50% special cells, some applications may require more special cells than normal IGBT cells. In fact, if the configuration shown in FIG. 3B were reversed, so that each special cell were a normal cell and each normal cell were a special cell, 75% of the cells would be special cells.

Figure 5A:
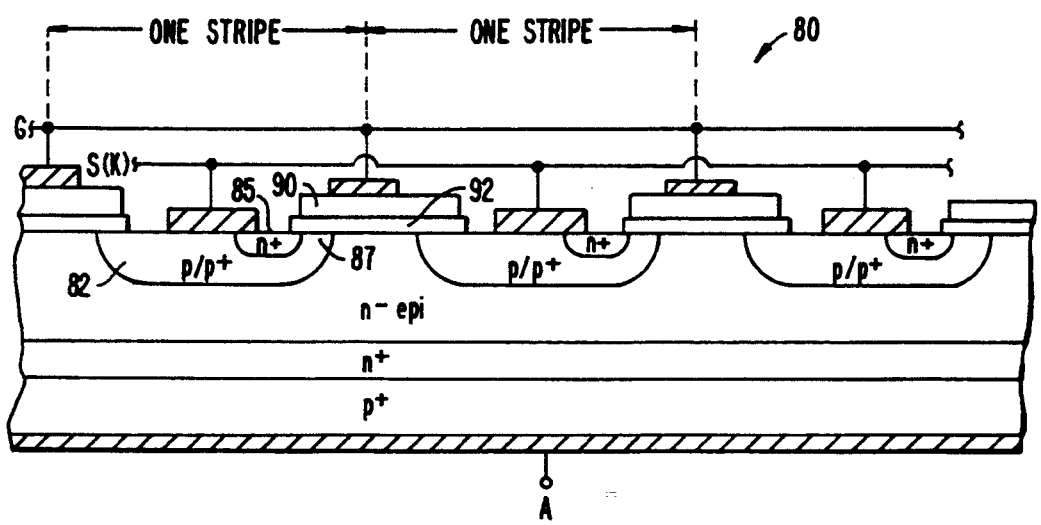
FIG. 5A is a schematic cross-section of a stripe embodiment of an IGTH according to the present invention.
Figure 5B:
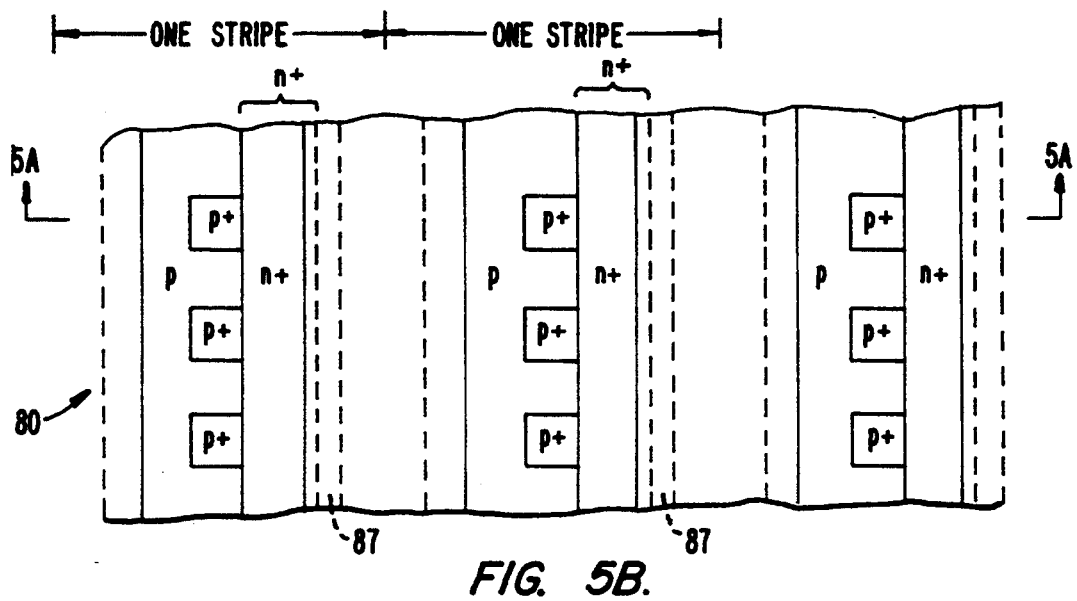
FIG. 5B is a top view showing the stripe layout for the IGTH of FIG. 5A.

FIG. 5A is a simplified sectional view of an IGTH 80, implemented in a stripe configuration. FIG. 5B shows a top view. The stripes are fabricated according to generally the same process as described above, with exceptions as noted below. Each stripe comprises a p/p+ body 82, a single n+ source region 85 located near one edge of the body so as to define a single channel 87. Polysilicon 90 overlies the channels and the regions between the bodies, being separated from the silicon surface by gate oxide 92. As in the case of the cellular implementation, the overall body doping is reduced to cause latching. The equivalent circuit of IGTH 80 corresponds to that in FIG. 4 except that nodes S and K are shorted together. This configuration can be characterized as each stripe having an IGBT stripe portion (the side with the source) and a special stripe portion (the side without the source).

Figure 6:
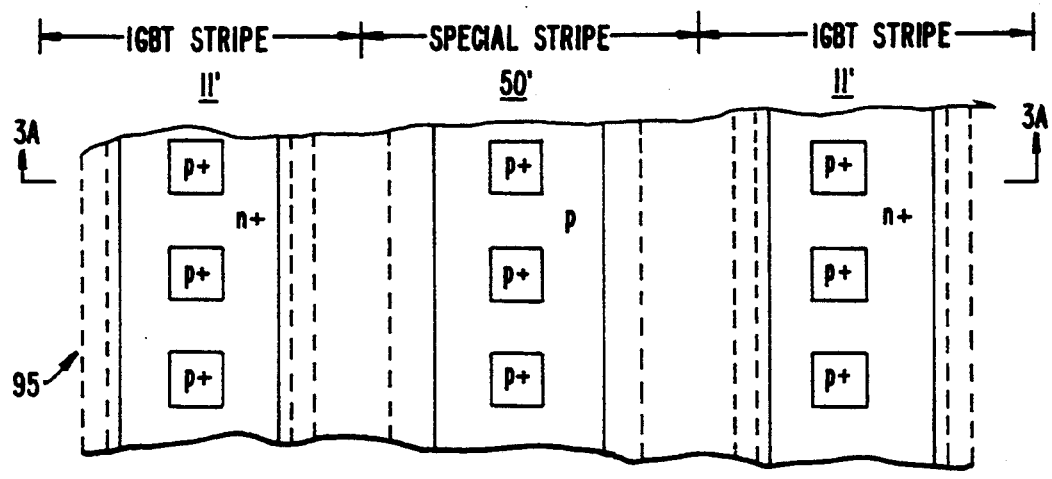
FIG. 6 is a top view showing an alternative stripe layout for the IGTH of FIG. 3A.

FIG. 6 is a top view of an IGTH 95, implemented in an alternative stripe configuration. This implementation consists of alternating IGBT stripes 11' (with reduced body doping) and special stripes 50'. The special stripes differ from the IGBT stripes in that the former have no source region. FIG. 3A provides a simplified sectional view.

Conclusion

In conclusion, it can be seen that the present invention provides a new insulated gate thyristor device which is turned on and off by one MOS gate, and acts as a transistor/thyristor combination. The device offers superior functionality over previous MOS-controlled thyristor devices because of its simple gate drive and its simple operation. Still, the device can be used as an IGBT (transistor) or as an IGTH (MOS gated thyristor), depending on the gate bias current level. Moreover, this ability to create different degrees of transistor versus thyristor action is achieved without increasing the number of processing steps in the fabrication of the device.

While the above is a full description of the preferred embodiments, various modifications, alternative constructions, and equivalents may be used. For example, while the description above is in terms of an NMOS process, it would be possible to implement the present invention in a PMOS process (where p and n are interchanged). The transistor corresponding to $T_5$ would then be an n-channel device. Since n-channel devices tend to have low resistance, such a variation would probably require a lower fraction of special cells than is needed for the NMOS device.

Therefore, the above description and illustrations should not be taken as limiting the scope of the present invention which is defined by the appended claims.

What is claimed is:

1. An insulated gate thyristor chip having an active region, comprising:
   a gate electrode overlying at least a portion of the active region of the chip;
   the active region of the chip including first and second interspersed pluralities of regions;
   a plurality of IGBT devices formed in said first plurality of regions, said IGBT devices each including a source of a first conductivity type disposed within a body, referred to as an IGBT body, of a second conductivity type with at least some of said IGBT devices having IGBT bodies having sufficiently low doping so as to cause said IGBT devices to enter a latched up condition when a gate voltage of a first polarity is applied to said gate electrode; and a plurality of first-type body elements devoid of sources formed in said second plurality of regions;

said body elements together with neighboring IGBT devices interrupting the latched up condition when a gate voltage of a second polarity, opposite said first polarity, is applied to said gate electrode.

2. The insulated gate thyristor chip of claim 1 wherein said IGBT devices and said body elements are arranged as cells.

3. The insulated gate thyristor chip of claim 2 wherein said IGBT devices and said body elements are arranged as stripes.

4. The insulated gate thyristor chip of claim 3 wherein:

each of said IGBT devices includes an elongate body having first and second longitudinal edges with said source extending near both edges;

each of said body elements is an elongate body; and said IGBT devices and said body elements alternate.

5. The insulated gate thyristor chip of claim 1 wherein:

said IGBT devices and said body elements are together defined by elongate bodies, each elongate body having first and second longitudinal edges with a source near one and only one edge so that each elongate body has a first elongate body portion with a source and a second elongate body portion without a source;

said IGBT devices include the first elongate body portions having sources; and said body elements include the second elongate body portions having no sources.

6. The insulated gate thyristor chip of claim 1 wherein said IGBT devices are n-channel devices and said body elements cooperate with said IGBT bodies to define p-channel MOSFET devices.

7. The insulated gate thyristor chip of claim 1 wherein said body elements are coupled to said sources.

8. An insulated gate thyristor chip comprising:

a semiconductor substrate of a first conductivity type;

a semiconductor layer of a second conductivity type, which is opposite said first type, formed on said substrate and bounded by a top surface;

a first plurality of first-type bodies formed in said second-type layer, each of said first plurality of bodies being bounded by a periphery and having a second-type source formed within the periphery of said body to define a channel between said source and the periphery of said body;

a second plurality of first-type bodies formed in said second-type layer and interspersed with said first plurality of bodies over a substantial portion of the chip's area, each of said second plurality of bodies being bounded by a periphery and having no second-type source formed within the periphery of said body;

said second-type layer having regions, called inter-body regions, located between said bodies in said first plurality of regions and said bodies in said second plurality of regions; and a conductive gate layer insulated from said second-type layer, said gate layer having a first portion overlying at least some of said channels and a second portion overlying at least some of said inter-body regions;

said first plurality of bodies, said sources, said channels, said substrate, said second-type layer, and said first portion of said gate layer together defining an IGBT having a first MOSFET, a first bipolar transistor, and a second bipolar transistor, said first and second bipolar transistors defining an inherent SCR;

at least some of said first plurality of bodies having sufficiently low doping so as to cause latch-up of said inherent SCR when said first MOSFET is turned on by a first voltage of a first polarity applied to said gate layer;

the combination of at least some of said first plurality of bodies, at least some of said second plurality of bodies, at least some of said inter-body regions, and said second portion of said gate layer together defining a second MOSFET that diverts base current from said second bipolar transistor, thereby interrupting the latch-up of said inherent SCR, when said second MOSFET is turned on by a second voltage of a second polarity, opposite said first polarity, applied to said gate layer;

whereby the insulated gate thyristor chip is latched when said first voltage is applied to said gate layer and, when latched, is turned off when said second voltage is applied to said gate layer.

9. The insulated gate thyristor chip of claim 8 wherein:

said first and second conductivity types are p-type and n-type, respectively;

said first and second MOSFETs are n-channel and p-channel devices, respectively; and said first and second bipolar transistors are PNP and NPN devices, respectively.

10. The insulated gate thyristor chip of claim 8 wherein said first plurality of bodies are characterized by relatively low body doping.

11. The insulated gate thyristor chip of claim 8 wherein said first and second pluralities of bodies are arranged as cells.

12. The insulated gate thyristor chip of claim 8 wherein said first and second pluralities of bodies are arranged as stripes.

13. The insulated gate thyristor chip of claim 8 wherein:

each of said first plurality of bodies is an elongate body having first and second longitudinal edges with said source extending near both edges;

each of said second plurality of bodies is an elongate body; and said first and second pluralities of bodies alternate.

14. The insulated gate thyristor chip of claim 8 wherein:

said first and second pluralities of bodies are together defined by elongate regions of first-type material, each region having first and second longitudinal edges with an elongate source near one and only one edge so that each elongate region has a first portion with a source and a second portion without a source;

said first plurality of bodies are defined by said first portions having a source region; and said second plurality of bodies are defined by said second portions having no source region.

15. The insulated gate thyristor chip of claim 8 wherein the source of said first MOSFET is coupled to the drain of said second MOSFET.

16. An insulated gate thyristor semiconductor device comprising:
- a semiconductor chip having an n-type top portion bounded by a top surface and a p-type substrate:
- a first plurality of cells, referred to as IGBT cells, formed in said top portion, each of said IGBT cells having a p-type body and an n-type source region formed within the periphery of the said body to define a channel between the source region and the periphery of said body;
- a plurality of cells, referred to as special cells, formed in said top portion and interspersed with said IGBT cells, each of said special cells having a p-type body, but no n-type source region; and
- a conductive gate layer insulated from said top surface, said gate layer having portions overlying said channels in said IGBT cells and portions overlying regions between the bodies of said IGBT cells and the bodies of said special cells;
- said IGBT cells and said portions of said gate layer overlying said channels together defining an n-channel MOSFET, a PNP bipolar transistor, and an NPN bipolar transistor, said PNP and NPN bipolar transistors defining an inherent SCR;
- at least some of said IGBT cells having p-type bodies of sufficiently low doping so as to cause latch-up of said inherent SCR when said n-channel MOSFET is turned on by a first voltage of a first polarity applied to said gate layer;
- the combination of at least some of said special cells and at least some of said IGBT cells, along with portions of said gate layer overlying regions of said top portion located therebetween, defining a p-channel MOSFET operable to divert base current from said NPN bipolar transistor when said p-channel MOSFET is turned on by a second voltage of a second polarity, opposite said first polarity, applied to said gate layer;
- whereby the insulated gate thyristor chip is latched when said first voltage is applied to said gate layer and, when latched, is turned off when said second voltage is applied to said gate layer.

17. The insulated gate thyristor chip of claim 16 wherein said p-type bodies of said special cells are coupled to source regions.

18. An insulated gate thyristor chip having an active region, comprising:
- a gate electrode overlying at least a portion of the active region of the chip
- the active region of the chip including first and second interspersed pluralities of regions;
- a plurality of IGBT devices formed in said first plurality of regions, said IGBT devices each including a source of a first conductivity type disposed within a body, referred to as an IGBT body, of a second conductivity type with at least some of said IGBT devices being configured to enter a latched up condition when a gate voltage of a first polarity is applied to said gate electrode;
- a plurality of first-type body elements devoid of sources formed in said second plurality of regions;
- said body elements together with neighboring IGBT devices interrupting the latched up condition when a gate voltage of a second, opposite polarity is applied to said gate electrode.

* * * * *